United States Patent
Sajjadi et al.

(10) Patent No.: US 9,059,714 B2
(45) Date of Patent: Jun. 16, 2015

(54) INDUCTOR-LESS 50% DUTY CYCLE WIDE-RANGE DIVIDE-BY-3 CIRCUIT

(71) Applicant: QUALCOMM Incorporated, San Diego, CA (US)

(72) Inventors: Ali Sajjadi, Irvine, CA (US); Babak Vakili-Amini, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/064,987

(22) Filed: Oct. 28, 2013

(65) Prior Publication Data

US 2015/0117564 A1    Apr. 30, 2015

(51) Int. Cl.
*H03K 23/50*    (2006.01)
*H04L 25/02*    (2006.01)

(52) U.S. Cl.
CPC ............... *H03K 23/50* (2013.01); *H04L 25/02* (2013.01)

(58) Field of Classification Search
CPC ... H03K 23/50; H03K 23/505; H03K 23/662; H04L 25/02
See application file for complete search history.

(56) References Cited

U.S. PATENT DOCUMENTS

| | | | |
|---|---|---|---|
| 4,348,640 A * | 9/1982 | Clendening | ...................... 377/48 |
| 5,365,119 A | 11/1994 | Kivari | |
| 6,389,095 B1 | 5/2002 | Sun | |
| 6,995,589 B2 | 2/2006 | Chen et al. | |
| 6,998,882 B1 * | 2/2006 | Chung | ........................... 327/115 |
| 7,518,459 B2 * | 4/2009 | Cheng et al. | ................... 332/103 |
| 7,579,883 B2 * | 8/2009 | Dekate et al. | ................. 327/117 |
| 7,881,422 B1 | 2/2011 | Chiang | |
| 2003/0020554 A1 | 1/2003 | Lin | |
| 2010/0134154 A1 | 6/2010 | He | |
| 2011/0148480 A1 | 6/2011 | Fan | |

FOREIGN PATENT DOCUMENTS

EP    2555430 A1    2/2013

OTHER PUBLICATIONS

Saeedi, S., et al., "A divide-by-3 frequency divider for I/Q generation in a multi-band frequency synthesizer," IEEE Asia Pacific Conference on Circuits and Systems, 2008. APCCAS 2008. pp. 1383-1386.
Zhou, C., et al., "A 50% duty cycle wide-locking range divide-by-3 divider up to 6GHz ," 2011 IEEE Radio Frequency Integrated Circuits Symposium (RFIC), 2011, pp. 1-4.
International Search Report and Written Opinion—PCT/US2014/060135—ISA/EPO—Jan. 7, 2015.

* cited by examiner

*Primary Examiner* — Leon Flores
(74) *Attorney, Agent, or Firm* — Patterson & Sheridan, L.L.P.

(57) ABSTRACT

Certain aspects of the present disclosure provide apparatus for producing an output signal having a duty cycle of 50% and a frequency that is one third that of an input signal. One example frequency dividing circuit for producing such an output signal generally includes first and second flip-flops; first, second, and third logic circuits, each configured to function equivalently to a logic OR gate; and an internal frequency dividing circuit configured to generate an output waveform having a frequency that is one half that of an input waveform.

30 Claims, 7 Drawing Sheets

INDUCTOR-LESS 50% DUTY CYCLE WIDE-RANGE DIVIDE-BY-3 CIRCUIT

TECHNICAL FIELD

Certain aspects of the present disclosure generally relate to electronic circuits and, more particularly, to 50% duty cycle divide-by-3 circuits and to frequency synthesizing circuits using such divide-by-3 circuits.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1xRTT (1 times Radio Transmission Technology, or simply 1x), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to 50% duty cycle divide-by-3 frequency dividing circuits. Such divide-by-3 circuits may be used in frequency synthesizing circuits (e.g., local oscillator (LO) generating circuits), such as those used in radio frequency (RF) transmitters, receivers, or transceivers for wireless communications.

Certain aspects of the present disclosure provide a first frequency dividing circuit for producing an output signal having a duty cycle of 50% and a first frequency that is one third that of an input signal. The first frequency dividing circuit generally includes first and second flip-flops; first, second, and third logic circuits, each configured to function equivalently to a logic OR gate; and a second frequency dividing circuit configured to generate an output waveform having a second frequency that is one half that of an input waveform.

According to certain aspects, an output of the first logic circuit is connected with an input of the first flip-flop, and an output of the second logic circuit is connected with an input of the second flip-flop. For certain aspects, an output of the first flip-flop is connected with a first input of the first logic circuit and with a first input of the second logic circuit. In this case, an output of the second flip-flop may be connected with a second input of the first logic circuit and with a second input of the second logic circuit.

For certain aspects, the output of the first flip-flop is connected with a first input of the third logic circuit. Here, the output of the second flip-flop may be connected with a second input of the third logic circuit. The input waveform of the second frequency dividing circuit may be based on an output of the third logic circuit.

According to certain aspects, the output signal changes only on same edges of outputs of the first and second flip-flops. For certain aspects, the same edges are rising edges of the outputs of the first and second flip-flops.

According to certain aspects, at least one of the first flip-flop or the second flip-flop is a master-slave edge-triggered delay (D) flip-flop. For certain aspects, at least one of the output of the first flip-flop or the output of the second flip-flop has a duty cycle of 33.3%.

According to certain aspects, the input waveform of the second frequency dividing circuit has a third frequency ⅔ that of the input signal.

According to certain aspects, the second frequency dividing circuit includes a third flip-flop. The third flip-flop may be a D flip-flop, such as a master-slave edge-triggered D flip-flop. For certain aspects, an output of the third logic circuit is connected with an input of the third flip-flop, and an output of the third flip-flop is fed back to connect with the input of the third flip-flop. For certain aspects, the output of the third flip-flop produces the output waveform having the second frequency that is one half that of the input waveform to the second frequency dividing circuit, a third frequency of the input waveform is ⅔ that of the input signal, and the output of the third flip-flop is the output signal having the duty cycle of 50% and the first frequency that is one third that of the input signal.

According to certain aspects, at least one of the first or second flip-flop is implemented in current mode logic (CML).

According to certain aspects, at least a portion of the first frequency dividing circuit is implemented using a 40 nm or smaller process technology.

According to certain aspects, at least one of the first, second, or third logic circuit comprises a symmetric logic OR gate.

According to certain aspects, the input signal is a clock signal having a 50% duty cycle.

According to certain aspects, the first frequency dividing circuit does not comprise an inductor.

According to certain aspects, the input signal and the output signal are differential signals.

Certain aspects of the present disclosure provide a local oscillator (LO) generation circuit for generating a local oscillating signal. The LO generation circuit generally includes a voltage-controlled oscillator (VCO) for outputting a global oscillating signal and a first frequency dividing circuit connected with the VCO and configured to produce an output signal having a first frequency one third that of the global oscillating signal and a duty cycle of 50%. The first frequency dividing circuit generally includes first and second flip-flops;

first, second, and third logic circuits, each configured to function equivalently to a logic OR gate; and a second frequency dividing circuit (e.g., an internal frequency dividing circuit, internal to the first frequency dividing circuit) configured to generate an output waveform having a second frequency that is one half that of an input waveform. The LO generation circuit further includes a third frequency dividing circuit configured to generate the local oscillating signal based on the output signal from the first frequency dividing circuit.

According to certain aspects, neither the first frequency dividing circuit nor the third frequency dividing circuit comprises an inductor.

According to certain aspects, a ratio of a maximum frequency to a minimum frequency of the local oscillating signal is greater than 2.

According to certain aspects, the LO generation circuit further includes a mixer configured to mix the output signal from the first frequency dividing circuit and the global oscillating signal, wherein the third frequency dividing circuit is configured to generate the local oscillating signal based on the mixed signal.

According to certain aspects, the local oscillating signal has a third frequency one half that of the output signal from the first frequency dividing circuit.

According to certain aspects, a ratio of a maximum VCO frequency to a minimum VCO frequency is at least 1.5.

According to certain aspects, the third frequency dividing circuit is configured to generate at least one of an in-phase (I) signal or a quadrature (Q) signal as the local oscillating signal.

According to certain aspects, the LO generation circuit comprises only a single VCO.

According to certain aspects, the output signal from the first frequency dividing circuit changes only on rising edges of outputs of the first and second flip-flops.

According to certain aspects, a range of the local oscillating signal is at least 550 MHz to 1250 MHz.

Certain aspects of the present disclosure provide an apparatus for wireless communications. The apparatus generally includes at least one antenna and a transmitter configured to transmit, via the at least one antenna, a data signal mixed with a local oscillating signal. The local oscillating signal is generated by a LO generation circuit, which generally includes a VCO for outputting a global oscillating signal and a first frequency dividing circuit connected with the VCO and configured to produce an output signal having a first frequency one third that of the global oscillating signal and a duty cycle of 50%. The first frequency dividing circuit generally includes first and second flip-flops; first, second, and third logic circuits, each configured to function equivalently to a logic OR gate; and a second frequency dividing circuit configured to generate an output waveform having a second frequency that is one half that of an input waveform. The LO generation circuit further includes a third frequency dividing circuit configured to generate the local oscillating signal based on the output signal from the first frequency dividing circuit.

Certain aspects of the present disclosure provide a first frequency dividing circuit for producing an output signal having a duty cycle of 50% and a first frequency that is one third that of an input signal. The first frequency dividing circuit generally includes first and second flip-flops, wherein the output signal changes only on rising edges of outputs of the first and second flip-flops, and a second frequency dividing circuit configured to generate an output waveform having a second frequency that is one half that of an input waveform. The input waveform may be based on the outputs of the first and second flip-flops, and the output signal may be based on the output waveform.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE), or some other standards. A TDMA system may implement GSM or some other standards. These various standards are known in the art.

An Example Wireless System

Figure 1:
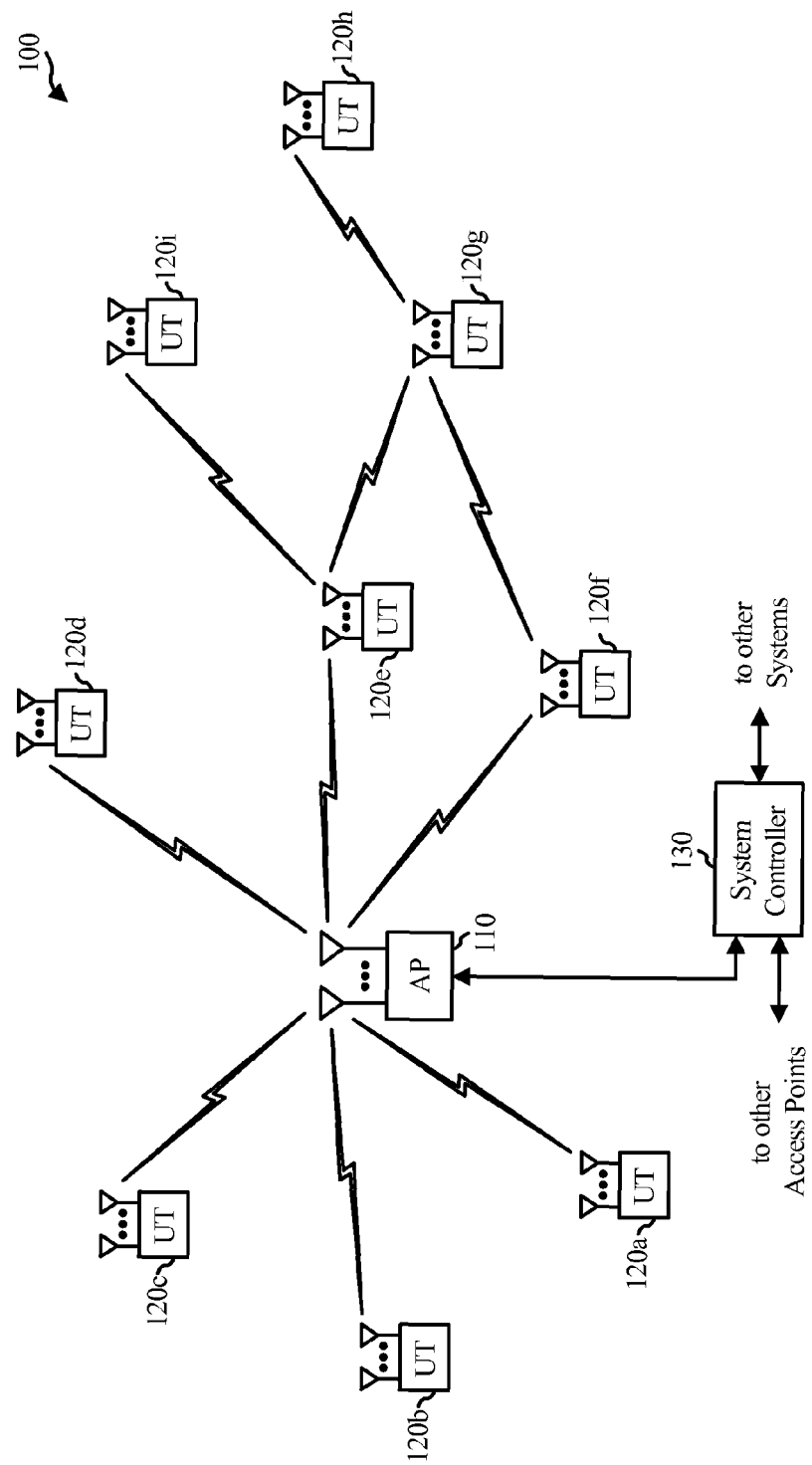
FIG. 1 is a diagram of an example wireless communications network in accordance with certain aspects of the present disclosure.

FIG. 1 illustrates a wireless communications system 100 with access points and user terminals. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal may be equipped with a single antenna (e.g., in order to keep costs down) or multiple antennas (e.g., where the additional cost can be supported).

Figure 2:
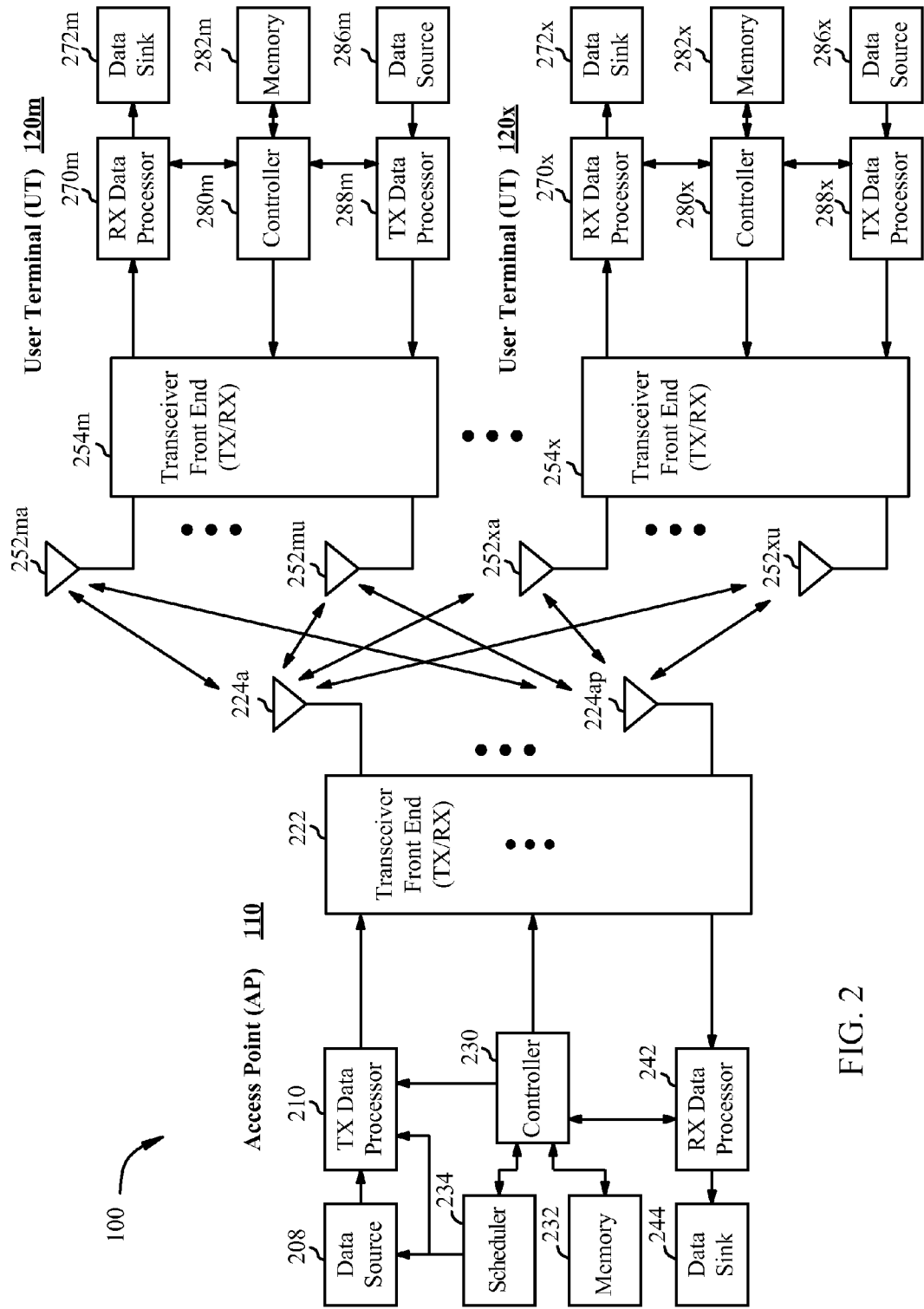
FIG. 2 is a block diagram of an example access point (AP) and example user terminals in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254.

A number $N_{up}$ of user terminals may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. For certain aspects of the present disclosure, a combination of the signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222.

At each user terminal 120, $N_{ut,m}$ antennas 252 receive the downlink signals from access point 110. For receive diversity at the user terminal 120, the transceiver front end 254 may select signals received from one of the antennas 252 for processing. For certain aspects of the present disclosure, a combination of the signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, and combinations thereof.

Example Divide-by-3 Circuit

A local oscillator (LO) is typically included in radio frequency front-ends (RFFEs) to generate a signal utilized to convert a signal of interest to a different frequency using a mixer. Known as heterodyning, this frequency conversion process produces the sum and difference frequencies of the LO frequency and the frequency of the signal of interest. The sum and difference frequencies are referred to as the beat frequencies. While it is desirable for the output of an LO to remain stable in frequency, tuning to different frequencies indicates using a variable-frequency oscillator, which involves compromises between stability and tunability. Contemporary systems employ frequency synthesizers with a voltage-controlled oscillator (VCO) to generate a stable, tunable LO with a particular tuning range.

When a wide tuning range (more than 2× the ratio of maximum and minimum frequency in the range) of a local oscillator is desired, it is difficult to cover the entire LO range with a single VCO (e.g., in 40 nm node, the achievable tuning range for VCO is less than 1.7×). In this case multiple VCOs are typically used to cover the LO frequency range, which is an area-hungry solution, consuming valuable real estate in today's battery-operated, portable devices.

One alternative approach is to run the VCO at higher frequencies and divide its output down with a programmable frequency divider to cover a wider range. In this approach, a VCO with a tuning range of 1.5× may be used, and a tuning range of 2.25× may be achieved by using a divide-by-2-or-3 circuit. The divide-by-3 functionality is desirable because if it is skipped (i.e., using a divide-by-2-or-4 module), a tuning range of at least 2× for the VCO may be specified, which is not achievable in current technologies.

Figure 3A:
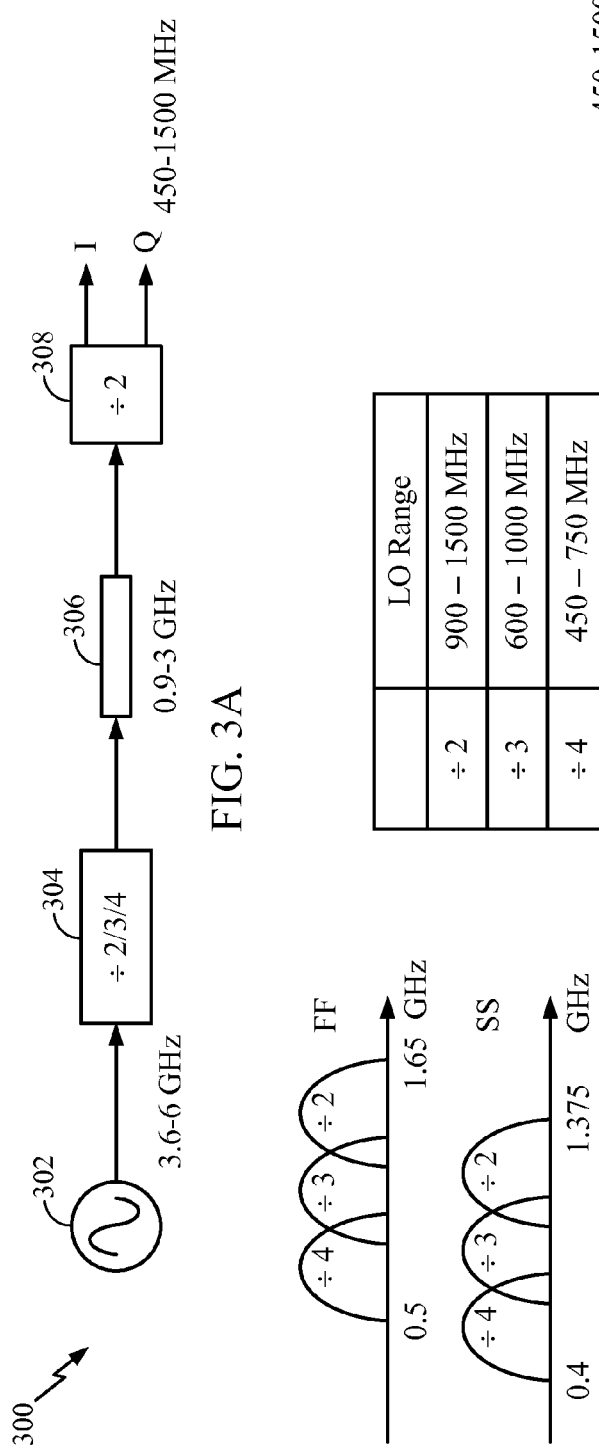
FIG. 3A is an example block diagram of a local oscillator (LO) generation chain with a selectable frequency divider, in accordance with certain aspects of the present disclosure.

FIG. 3A is an example block diagram of a local oscillator (LO) generation chain 300, in accordance with certain aspects of the present disclosure. The LO generation chain 300 may include a VCO 302, a selectable frequency divider 304, a delay line 306, and a divide-by-2 frequency divider 308 for producing in-phase (I) and quadrature (Q) signals. For example, the VCO 302 may have a tuning range of 1.67× (ranging from 3.6 to 6 GHz). The select frequency divider 304 may be capable of frequency dividing the output of the VCO 302 by 2, by 3, or by 4 with the use of a divide-by-2 circuit, a divide-by-3 circuit, and a second divide-by-2 circuit whose input is the output of the first divide-by-2 circuit, respectively. With the VCO 302 ranging from 3.6 to 6 GHz, the frequency ranges of the divided oscillator signal being sent to the divide-by-2 frequency divider 308 via the delay line 306 are 1.8 to 3 GHz (divide-by-2), 1.2 to 2 GHz (divide-by-3), and 0.9 to 1.5 GHz (divide-by-4). After frequency dividing by 2 in the frequency divider 308, the I and Q signals have an overall LO tuning range of 3.33× (0.45 GHz to 1.5 GHz).

Figure 3B:
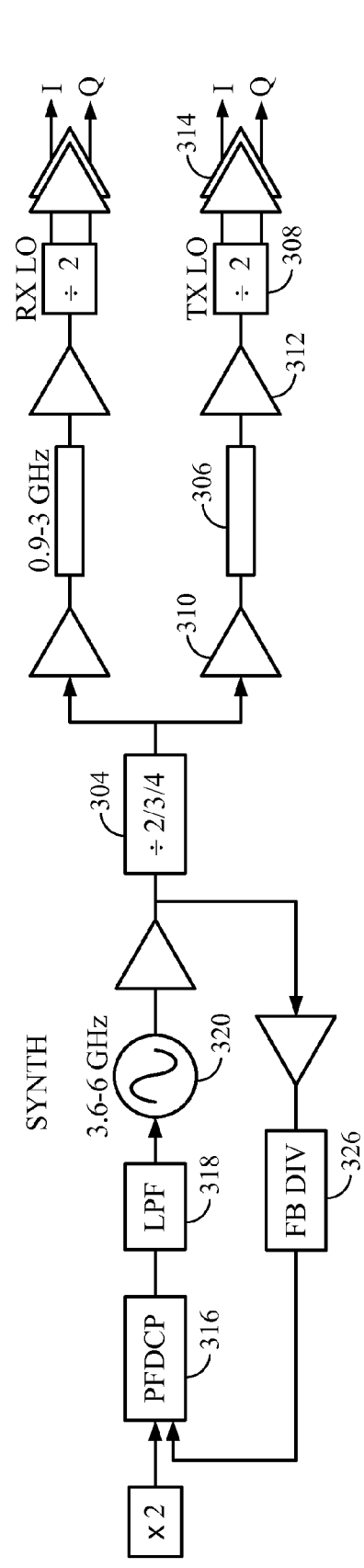
FIG. 3B is a more detailed example block diagram of the LO generation chain of FIG. 3A, in accordance with certain aspects of the present disclosure.

FIG. 3B is a more detailed example block diagram of the LO generation chain 300 of FIG. 3A, in accordance with certain aspects of the present disclosure. FIG. 3B illustrates the various components of the VCO 302 and different LO generation paths for transmitter LO signals (TX LO) and receiver LO signals (RX LO). The VCO 302 may include a variable frequency oscillator 320 whose output is controlled in a phase-locked loop (PLL). The PLL in FIG. 3B includes a phase frequency detector and charge pump (PFDCP) 316, a low pass filter (LPF) 318, and a feedback divider 326 fed back to an input of the PFDCP 316. Since operation of these components are understood by a person having ordinary skill in the art of radio frequency (RF) electronics, their operation is not described in further detail. The different LO generation paths may include buffers 310 between the selectable frequency divider 304 and the individual delay lines 306, buffers 312 between the individual delay lines 306 and the individual divide-by-2 frequency dividers 308, and amplifiers 314 for boosting the output of the frequency dividers 308.

For certain aspects, each output (divide-by-2, divide-by-3, or divide-by-4) of the selectable frequency divider 304 may be connected with a different pair of buffers 310. Activating certain buffers 310 and deactivating others may be used to implement the actual frequency dividing circuit selection.

Figure 4:
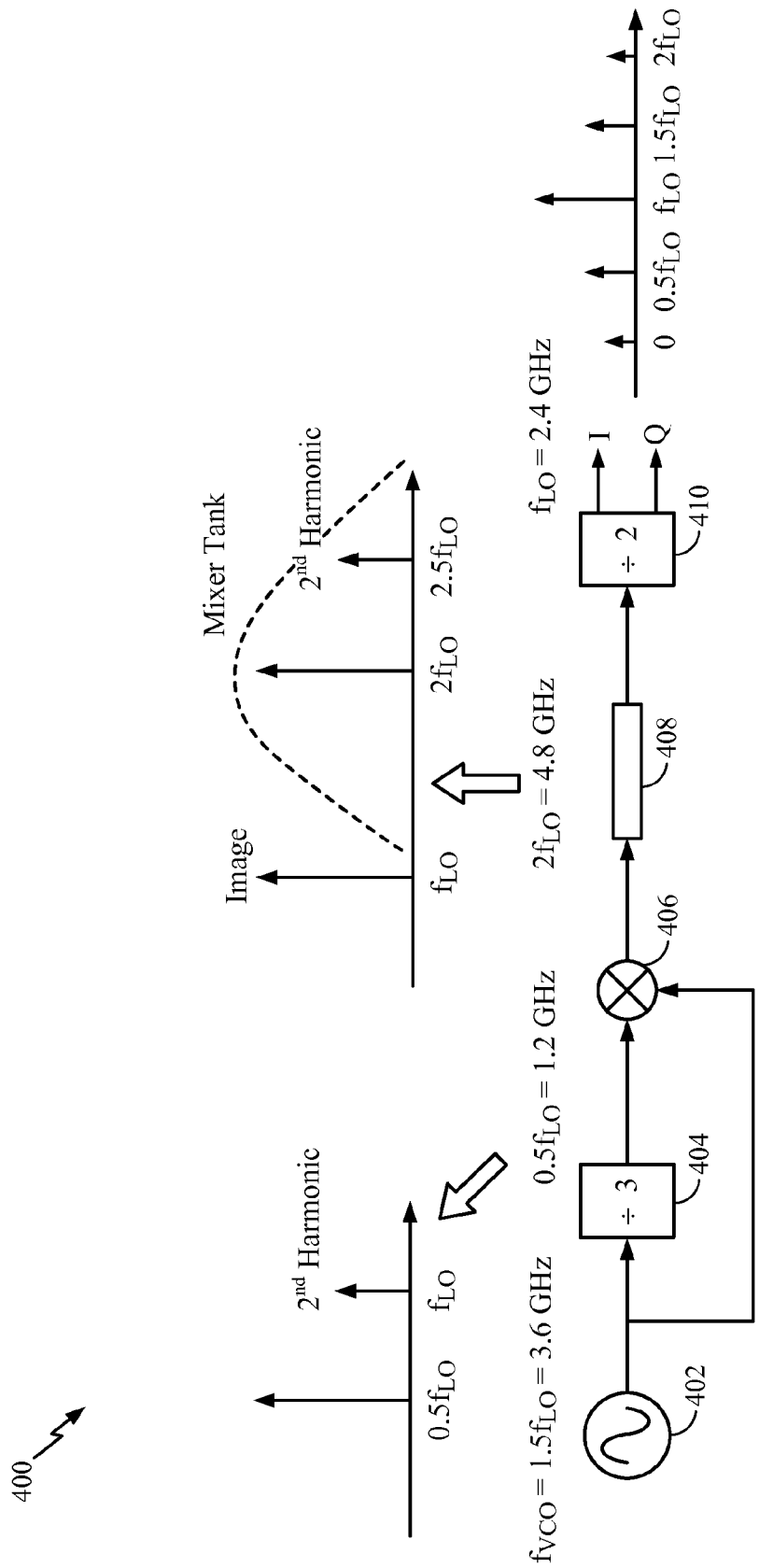
FIG. 4 is an example block diagram of an LO generation chain with a divide-by-3 frequency dividing circuit, in accordance with certain aspects of the present disclosure.

FIG. 4 is an example block diagram of an offset LO generation chain 400, in accordance with certain aspects of the present disclosure. The offset LO generation chain 400 may include a VCO 402, a divide-by-3 frequency divider 404, a mixer 406, a delay line 408, and a divide-by-2 frequency divider 410 for producing I and Q signals. For example, the VCO 402 may produce an output signal oscillating at 1.5 $f_{LO}$ (e.g., 3.6 GHz as illustrated). The frequency divider 410 produces a signal having a frequency one third of that of the VCO's output frequency (e.g., 0.5 $f_{LO}$=1.2 GHz). The second harmonic of this signal—after frequency converting in the mixer 406 with the VCO output to create a beat frequency at 2 $f_{LO}$ (e.g., 4.8 GHz) and frequency dividing by 2 in the frequency divider 410—creates spurs at 0.5 $f_{LO}$ and 1.5 $f_{LO}$, whereas the intended local oscillator output frequency is $f_{LO}$ (e.g., 2.4 GHz).

The output of the frequency dividers (e.g., selectable frequency divider 304 and divide-by-3 frequency divider 404) in FIGS. 3A, 3B, and 4 should have a 50% duty cycle since the output will be subsequently used to create the I and Q signals. Any error in duty cycle will translate to I/Q mismatch and/or spurs. While it is easy to achieve 50% duty cycle clocks out of even dividers, it is difficult for odd dividers, especially at high frequencies.

Conventional divide-by-3 circuits generate a 33% duty cycle since these circuits only count one edge of the input clock. Most available 50% duty cycle ideas cannot be used in high frequency and for wide frequency ranges. Furthermore, other 50% duty cycle divide-by-3 circuits either rely on inductive filtering to filter the harmonics and recover duty cycle or have multiple frequency modes (i.e., they can oscillate at multiple frequencies) and are unreliable for a wide range of input frequencies.

Existing system solutions avoid 50% duty cycle divide-by-3 circuits by one of three methods: (1) using two or more VCOs to cover a wide LO range; (2) using inductors to provide more second harmonic filtering in offset LO generation; or (3) using divide-by-2 instead of divide-by-3 in offset LO generation, where the image creates a spur at 0.33 $f_{LO}$ and more filtering is desired. However, all three of these solutions involve substantial area (i.e., consume extra area unnecessarily).

A few 50% duty cycle divide-by-3 circuits have already been developed, such as those described in Saeedi, S., et al., "A Divide-by-3 Frequency Divider for I/Q Generation in a Multi-band Frequency Synthesizer," *Circuits and Systems*, IEEE Asia Pacific Conference on Circuits and Systems (APCCAS) 2008, pp. 1383, 1386 and Zhou, C., et al., "A 50% Duty Cycle Wide-Locking Range Divide-by-3 Divider up to 6 GHz," *Radio Frequency Integrated Circuits Symposium (RFIC)*, 2011 IEEE, pp. 1, 4. These circuits involve delay-cell injection locked oscillators. However, these can have a faulty mode in which the output frequency equals the input frequency (in effect, a divide-by-1 circuit rather than a divide-by-3 circuit). Large clock amplitudes, high supply, or fast corners increase the chance of faulty oscillation in the lower end of a large frequency range.

Another 50% duty cycle divide-by-3 circuit is described in U.S. Pat. No. 6,389,095 to Sun, entitled "Divide-by-3 Circuit" and filed Oct. 27, 2000. This circuit has a systematic duty cycle error due to using both rising and falling edges and the potential mismatch therebetween. The duty cycle error generally grows with frequency.

Accordingly, what is needed is a 50% duty cycle divide-by-3 circuit that occupies smaller real estate and/or has lower duty cycle error compared to conventional designs, without a faulty operational mode.

Certain aspects of the present disclosure provide a fully differential, inductor-less, 50% duty cycle divide-by-3 architecture. Such divide-by-3 circuits may be used in the LO generation chain to increase the tuning range with the use of a programmable frequency divider (as in FIGS. 3A and 3B) or to reduce spurs in offset LO generation (as in FIG. 4).

Figure 5:
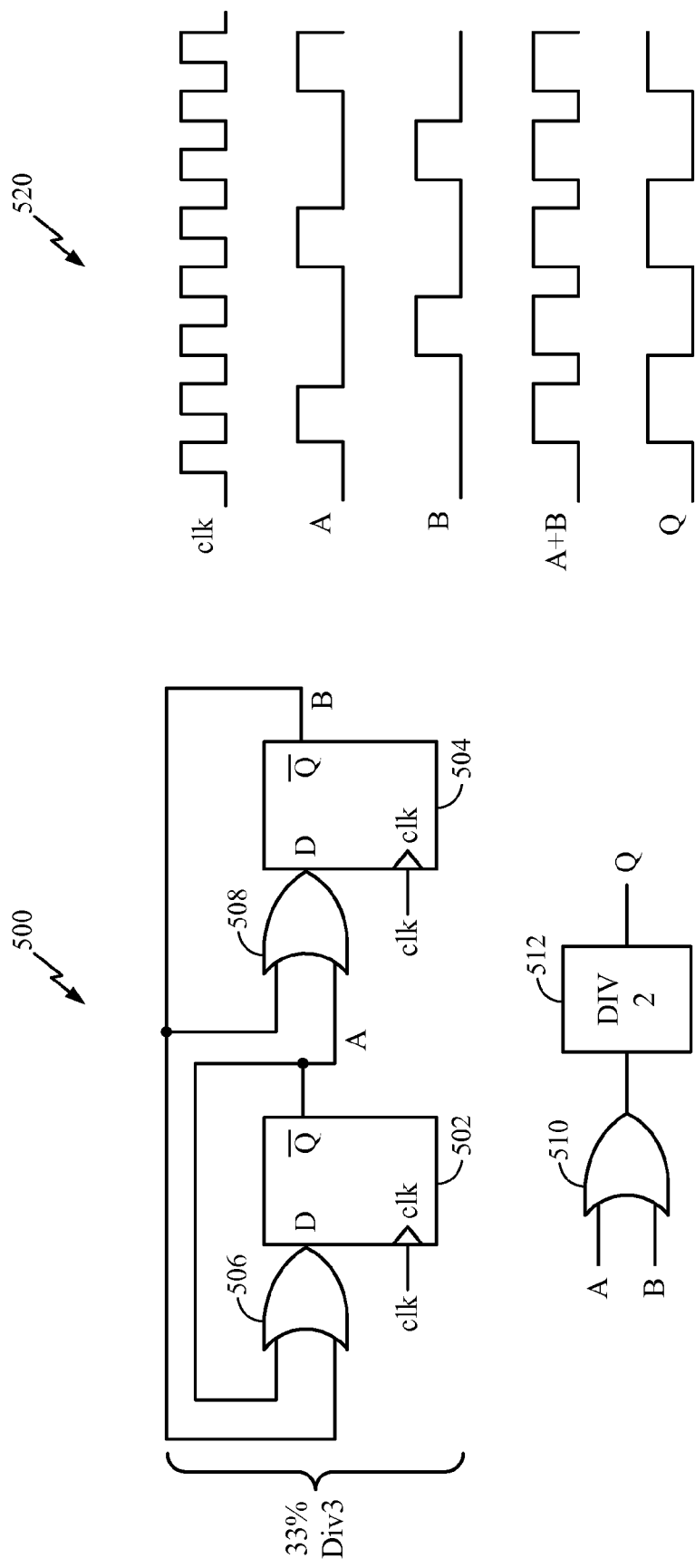
FIG. 5 is an example block diagram of a 50% duty cycle divide-by-3 circuit and an associated timing diagram, in accordance with certain aspects of the present disclosure.

FIG. 5 is an example block diagram of a 50% duty cycle divide-by-3 circuit 500 and an associated timing diagram 520 for various nodes in the circuit 500, in accordance with certain aspects of the present disclosure. The divide-by-3 circuit 500 generates two 33% duty cycle outputs (A and B) with 180° phase difference using two flip-flops 502, 504 and two logic OR circuits 506, 508 (e.g., OR gates or circuits logically equivalent to OR gates), connected as illustrated in FIG. 5.

Figure 6:
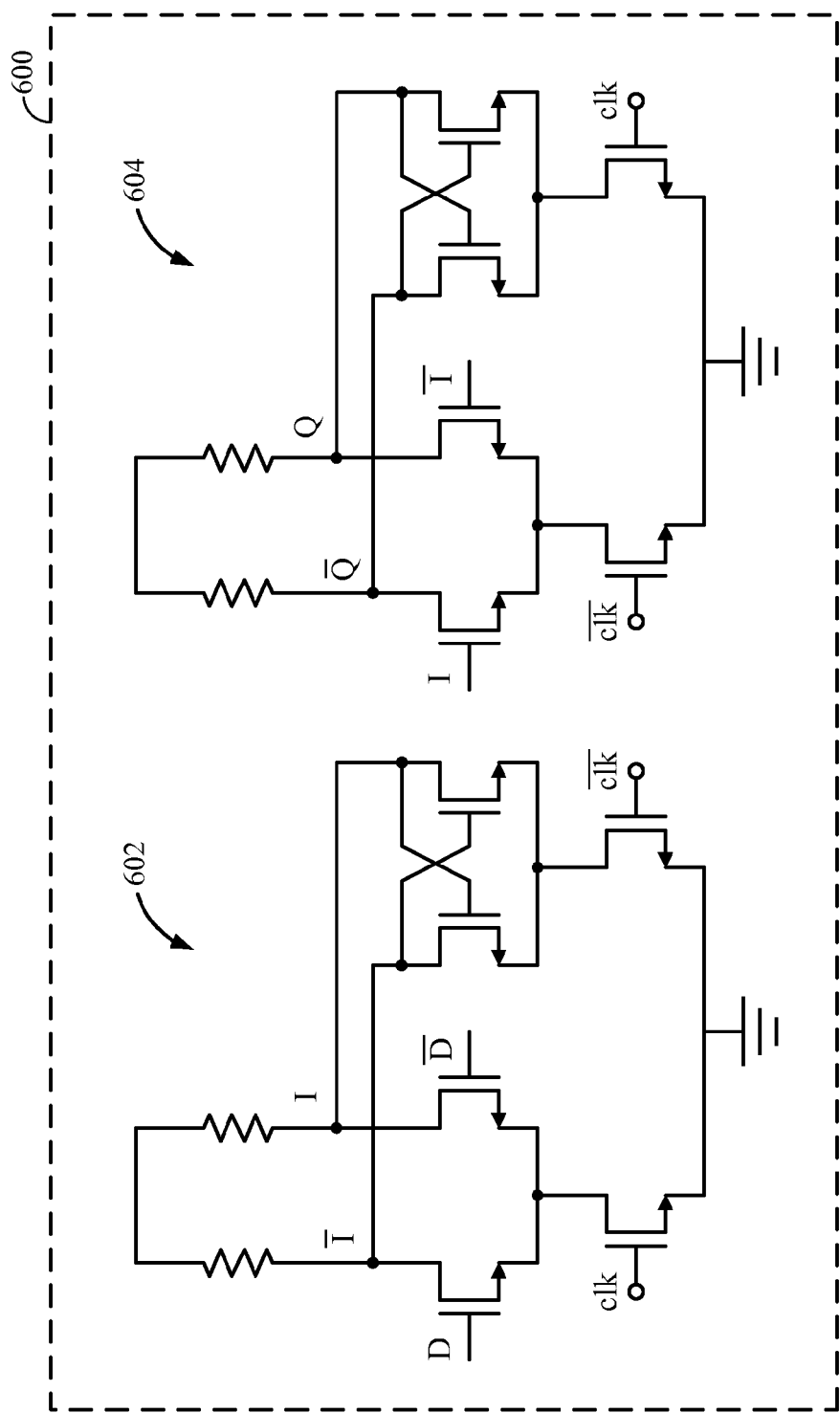
FIG. 6 illustrates an example circuit for a master-slave delay (D) flip-flop implemented in current mode logic (CML), in accordance with certain aspects of the present disclosure.

The flip-flops 502, 504 may be delay (D) flip-flops as illustrated in FIG. 5. For certain aspects, the flip-flops 502, 504 may be master-slave edge-triggered D flip-flops, which may be implemented in current mode logic (CML). Also known as source-coupled logic (SCL), CML is a high-speed differential digital logic family whose speed is mainly due to a lower output voltage swing compared to static CMOS circuits, as well as very fast current switching taking place at the input differential pair transistors. FIG. 6 illustrates an example circuit for a master-slave edge-triggered D flip-flop 600 implemented in CML. The master-slave flip-flop 600 includes a master flip-flop circuit 602 and a slave flip-flop circuit 604 connected in series with—and whose operation depends on outputs (I and I-bar) from—the master flip-flop circuit 602.

Returning to FIG. 5, the Q-bar output from the flip-flops 502, 504 may represent one of the complementary outputs from the slave flip-flop 604. The flip-flops 502, 504 are clocked with complementary clk and clk-bar to create 180° phase shifts in the two outputs. Note that since the signals may be differential in CML, clk-bar is available naturally by just flipping the clk input lines fed to clk-bar.

A third logic OR circuit 510 receives the two 33% duty cycle outputs (A and B) and outputs a signal (A+B) having ⅔ the input frequency. The output frequency of the third logic OR circuit 510 is divided by 2 in a divide-by-2 circuit 512 to create an overall output frequency that is ⅓ of the input frequency (i.e., a divide-by-3 frequency divider). The output (Q) of the divide-by-2 circuit 512 guarantees a 50% duty cycle. Because only the rising edges of the flip-flop outputs (A and B) are used (as illustrated in the timing diagram 520), there is less duty cycle error than conventional 50% duty cycle divide-by-3 circuits.

The divide-by-3 circuit 500 may be implemented in 55 or 40 nm technology, for example. The divide-by-3 circuit 500 may operate at input frequencies up to at least 7 GHz, with an input sensitivity better than 400 mV, for example.

Figure 7:
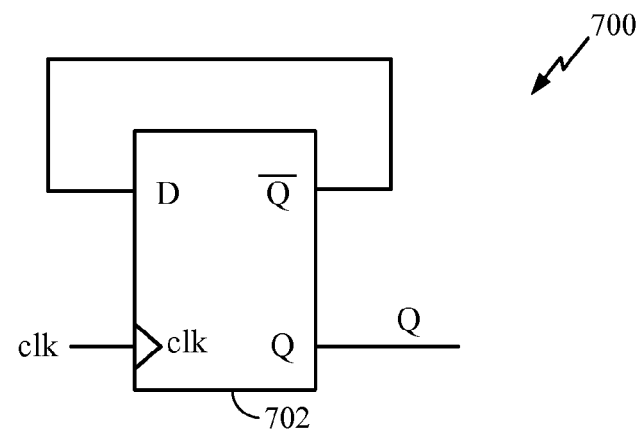
FIG. 7 is a schematic diagram of an example divide-by-2 circuit, in accordance with certain aspects of the present disclosure.

FIG. 7 is a schematic diagram of an example divide-by-2 circuit 700, which may be used as the divide-by-2 circuit 512 of FIG. 5. The divide-by-2 circuit 700 may include a D flip-flop whose Q-bar output is fed back to the D input, such that the Q output has a frequency that is one half the frequency of the clk input. Since the D flip-flop 702 is triggered on only the rising edges of the clk input, the Q output has a 50% duty cycle with low error. When the divide-by-2 circuit 700 is implemented in the divide-by-3 circuit 500 of FIG. 5, the clk input to D flip-flop 702 may be the output of the third logic OR circuit 510, and the Q output of the D flip-flop 702 may be the Q output of the divide-by-2 circuit 512.

Figure 8:
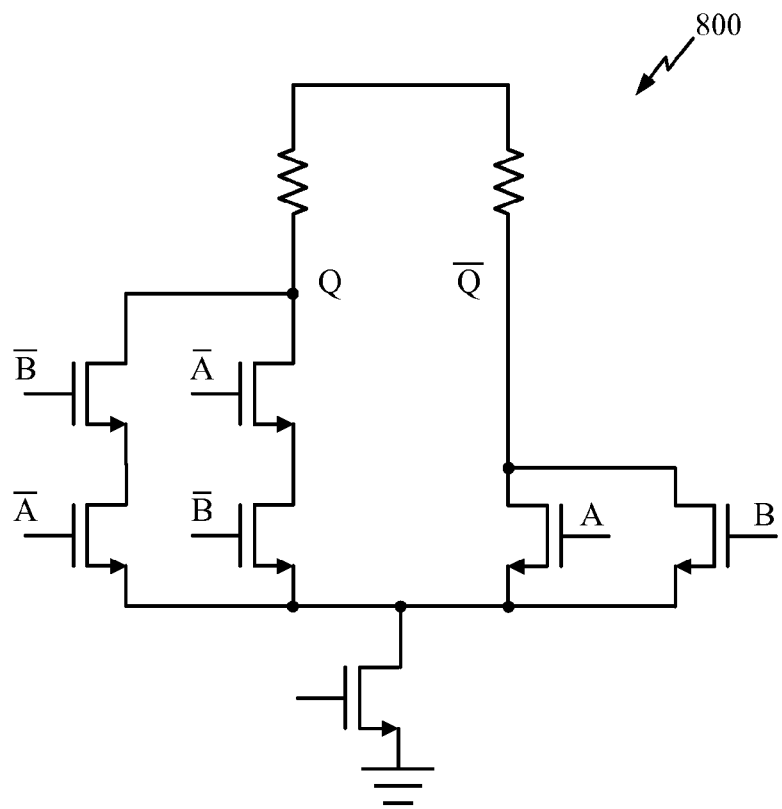
FIG. 8 illustrates an example circuit for a logic OR gate, in accordance with certain aspects of the present disclosure.

FIG. 8 illustrates an example circuit for a logic OR gate 800 implemented in CML, in accordance with certain aspects of the present disclosure. The logic OR gate 800 may be used for any of the logic OR circuits 506, 508, 510 in FIG. 5. The logic OR gate 800 is symmetric with respect to its inputs (A, B, A-bar, and B-bar), which helps in achieving a 50% duty cycle with low error in the divide-by-3 circuit 500.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252*ma* through 252*mu* of the user terminal 120*m* portrayed in FIG. 2 or the antennas 224*a* through 224*ap* of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252*ma* through 252*mu* of the user terminal 120*m* portrayed in FIG. 2 or the antennas 224*a* through 224*ap* of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A first frequency dividing circuit for producing an output signal having a duty cycle of 50% and a first frequency that is one third that of an input signal, comprising:
    first and second flip-flops;
    first, second, and third logic circuits, each configured to function equivalently to a logic OR gate, wherein an output of the first logic circuit is connected with an input of the first flip-flop, wherein an output of the second logic circuit is connected with an input of the second flip-flop, wherein an output of the first flip-flop is connected with a first input of the first logic circuit and with a first input of the second logic circuit, wherein an output of the second flip-flop is connected with a second input of the first logic circuit and with a second input of the second logic circuit, wherein the output of the first flip-flop is connected with a first input of the third logic circuit, and wherein the output of the second flip-flop is connected with a second input of the third logic circuit; and
    a second frequency dividing circuit configured to generate an output waveform having a second frequency that is one half that of an input waveform, wherein the input waveform is based on an output of the third logic circuit.

2. The first frequency dividing circuit of claim 1, wherein the output signal changes only on same edges of outputs of the first and second flip-flops.

3. The first frequency dividing circuit of claim 2, wherein the same edges are rising edges of the outputs of the first and second flip-flops.

4. The first frequency dividing circuit of claim 1, wherein at least one of the first flip-flop or the second flip-flop is a master-slave edge-triggered delay (D) flip-flop.

5. The first frequency dividing circuit of claim 1, wherein at least one of the output of the first flip-flop or the output of the second flip-flop has a duty cycle of 33.3%.

6. The first frequency dividing circuit of claim 1, wherein the input waveform of the second frequency dividing circuit has a third frequency ⅔ that of the input signal.

7. The first frequency dividing circuit of claim 1, wherein the second frequency dividing circuit comprises a third flip-flop.

8. The first frequency dividing circuit of claim 7, wherein the third flip-flop comprises a delay (D) flip-flop.

9. The first frequency dividing circuit of claim 7, wherein an output of the third logic circuit is connected with a clock input of the third flip-flop and wherein a complementary output of the third flip-flop is fed back to connect with an input of the third flip-flop.

10. The first frequency dividing circuit of claim 9, wherein an output of the third flip-flop produces the output waveform having the second frequency that is one half that of the input waveform to the second frequency dividing circuit, wherein a third f frequency of the input waveform is ⅔ that of the input signal, and wherein the output of the third flip-flop is the output signal having the duty cycle of 50% and the first frequency that is one third that of the input signal.

11. The first frequency dividing circuit of claim 1, wherein at least one of the first or second flip-flop is implemented in current mode logic (CML).

12. The first frequency dividing circuit of claim 1, wherein at least a portion of the first frequency dividing circuit is implemented using a 40 nm or smaller process technology.

13. The first frequency dividing circuit of claim 1, wherein at least one of the first, second, or third logic circuit comprises a symmetric logic OR gate.

14. The first frequency dividing circuit of claim 1, wherein the input signal is a clock signal having a 50% duty cycle.

15. The first frequency dividing circuit of claim 1, wherein the first frequency dividing circuit does not comprise an inductor.

16. The first frequency dividing circuit of claim 1, wherein the input signal and the output signal are differential signals.

17. A local oscillator (LO) generation circuit for generating a local oscillating signal, comprising:
a voltage-controlled oscillator (VCO) for outputting a global oscillating signal;
a first frequency dividing circuit connected with the VCO and configured to produce an output signal having a first frequency one third that of the global oscillating signal and a duty cycle of 50%, wherein the first frequency dividing circuit comprises:
first and second flip-flops;
first, second, and third logic circuits, each configured to function equivalently to a logic OR gate, wherein an output of the first logic circuit is connected with an input of the first flip-flop, wherein an output of the second logic circuit is connected with an input of the second flip-flop, wherein an output of the first flip-flop is connected with a first input of the first logic circuit and with a first input of the second logic circuit, wherein an output of the second flip-flop is connected with a second input of the first logic circuit and with a second input of the second logic circuit, wherein the output of the first flip-flop is connected with a first input of the third logic circuit, and wherein the output of the second flip-flop is connected with a second input of the third logic circuit; and
a second frequency dividing circuit configured to generate an output waveform having a second frequency that is one half that of an input waveform, wherein the input waveform is based on an output of the third logic circuit; and
a third frequency dividing circuit configured to generate the local oscillating signal based on the output signal from the first frequency dividing circuit.

18. The LO generation circuit of claim 17, wherein neither the first frequency dividing circuit nor the third frequency dividing circuit comprises an inductor.

19. The LO generation circuit of claim 17, wherein a ratio of a maximum frequency to a minimum frequency of the local oscillating signal is greater than 2.

20. The LO generation circuit of claim 17, further comprising a mixer configured to mix the output signal from the first frequency dividing circuit and the global oscillating signal, wherein the third frequency dividing circuit is configured to generate the local oscillating signal based on the mixed signal.

21. The LO generation circuit of claim 17, wherein the local oscillating signal has a third frequency one half that of the output signal from the first frequency dividing circuit.

22. The LO generation circuit of claim 17, wherein a ratio of a maximum VCO frequency to a minimum VCO frequency is at least 1.5.

23. The LO generation circuit of claim 17, wherein the third frequency dividing circuit is configured to generate at least one of an in-phase (I) signal or a quadrature (Q) signal as the local oscillating signal.

24. The LO generation circuit of claim 17, wherein the LO generation circuit comprises only a single VCO.

25. The LO generation circuit of claim 17, wherein the output signal from the first frequency dividing circuit changes only on rising edges of outputs of the first and second flip-flops.

26. The LO generation circuit of claim 17, wherein a range of the local oscillating signal is at least 550 MHz to 1250 MHz.

27. An apparatus for wireless communications, comprising:
at least one antenna; and
a transmitter configured to transmit, via the at least one antenna, a data signal mixed with a local oscillating signal, wherein the local oscillating signal is generated by a local oscillator (LO) generation circuit, comprising:
a voltage-controlled oscillator (VCO) for outputting a global oscillating signal;
a first frequency dividing circuit connected with the VCO and configured to produce an output signal having a first frequency one third that of the global oscillating signal and a duty cycle of 50%, wherein the first frequency dividing circuit comprises:
first and second flip-flops;
first, second, and third logic circuits, each configured to function equivalently to a logic OR gate, wherein an output of the first logic circuit is connected with an input of the first flip-flop, wherein an output of the second logic circuit is connected with an input of the second flip-flop, wherein an output of the first flip-flop is connected with a first input of the first logic circuit and with a first input of the second logic circuit, wherein an output of the second flip-flop is connected with a second input of the first logic circuit and with a second input of the second logic circuit, wherein the output of the first flip-flop is connected with a first input of the third logic circuit, and wherein the output of the second flip-flop is connected with a second input of the third logic circuit; and
a second frequency dividing circuit configured to generate an output waveform having a second frequency that is one half that of an input waveform, wherein the input waveform is based on an output of the third logic circuit; and
a third frequency dividing circuit configured to generate the local oscillating signal based on the output signal from the first frequency dividing circuit.

28. A first frequency dividing circuit for producing an output signal having a duty cycle of 50% and a first frequency that is one third that of an input signal, comprising:
first and second flip-flops, wherein the output signal changes only on rising edges of outputs of the first and second flip-flops; and
a second frequency dividing circuit configured to generate an output waveform having a second frequency that is one half that of an input waveform, wherein the input waveform is based on the outputs of the first and second flip-flops and wherein the output signal is based on the output waveform.

29. The first frequency dividing circuit of claim 28, wherein at least one of the output of the first flip-flop or the output of the second flip-flop has a duty cycle of 33.3% and wherein the input waveform of the second frequency dividing circuit has a third frequency ⅔ that of the input signal.

30. The first frequency dividing circuit of claim 28, wherein the second frequency dividing circuit comprises a third flip-flop, wherein a complementary output of the third flip-flop is fed back to connect with an input of the third flip-flop, wherein an output of the third flip-flop produces the output waveform having the second frequency that is one half that of the input waveform to the second frequency dividing circuit, wherein a third frequency of the input waveform is ⅔ that of the input signal, and wherein the output of the third flip-flop is the output signal having the duty cycle of 50% and the first frequency that is one third that of the input signal.

* * * * *